US007923840B2

(12) United States Patent
Costrini et al.

(10) Patent No.: US 7,923,840 B2
(45) Date of Patent: Apr. 12, 2011

(54) ELECTRICALLY CONDUCTIVE PATH FORMING BELOW BARRIER OXIDE LAYER AND INTEGRATED CIRCUIT

(75) Inventors: Gregory Costrini, Hopewell Junction, NY (US); Ramachandra Divakaruni, Ossining, NY (US); Jeffrey P. Gambino, Westford, VT (US); Randy W. Mann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 11/621,699

(22) Filed: Jan. 10, 2007

(65) Prior Publication Data
US 2008/0166857 A1 Jul. 10, 2008

(51) Int. Cl.
*H01L 23/48* (2006.01)
(52) U.S. Cl. . 257/758; 257/750; 257/760; 257/E27.098; 257/E21.661
(58) Field of Classification Search .......... 257/758, 257/760, E21.661, E27.098, 347, 750; 438/455
See application file for complete search history.

(56) References Cited

U.S. PATENT DOCUMENTS

| | | | | |
|---|---|---|---|---|
| 6,136,696 A * | 10/2000 | Horiba | | 438/639 |
| 6,429,477 B1 | 8/2002 | Mandelman et al. | | |
| 6,645,796 B2 * | 11/2003 | Christensen et al. | | 438/149 |
| 6,667,234 B2 * | 12/2003 | Wu et al. | | 438/675 |
| 6,670,716 B2 * | 12/2003 | Christensen et al. | | 257/762 |
| 6,689,658 B2 * | 2/2004 | Wu | | 438/257 |
| 6,713,802 B1 * | 3/2004 | Lee | | 257/295 |
| 6,787,850 B1 * | 9/2004 | Pelloie | | 257/347 |
| 6,927,467 B2 * | 8/2005 | Kim | | 257/421 |
| 6,953,726 B2 | 10/2005 | Nowak et al. | | |
| 2002/0014680 A1 * | 2/2002 | Tottori | | 257/529 |
| 2002/0053702 A1 * | 5/2002 | Bryant et al. | | 257/347 |
| 2002/0140030 A1 * | 10/2002 | Mandelman et al. | | 257/347 |
| 2003/0001658 A1 | 1/2003 | Matsumoto | | |
| 2003/0170936 A1 * | 9/2003 | Christensen et al. | | 438/151 |
| 2003/0189231 A1 * | 10/2003 | Clevenger et al. | | 257/355 |
| 2004/0089920 A1 * | 5/2004 | Joshi et al. | | 257/629 |
| 2004/0166639 A1 * | 8/2004 | Lin et al. | | 438/276 |
| 2005/0142703 A1 * | 6/2005 | Zahurak et al. | | 438/157 |
| 2005/0280040 A1 * | 12/2005 | Kasko et al. | | 257/213 |
| 2006/0145347 A1 * | 7/2006 | Aida | | 257/758 |

* cited by examiner

*Primary Examiner* — Thanh V Pham
*Assistant Examiner* — Duy T Nguyen
(74) *Attorney, Agent, or Firm* — Ian D. MacKinnon; Hoffman Warnick LLC

(57) ABSTRACT

Methods of forming an electrically conductive path under a barrier oxide layer of a semiconductor-on-insulator (SOI) substrate and an integrated circuit including the path are disclosed. In one embodiment, the method includes forming an electrically conductive path below a barrier oxide layer of a semiconductor-on-insulator (SOI) substrate, the method comprising: forming a first barrier oxide layer on a semiconductor substrate; forming the electrically conductive path within the first barrier oxide layer; and forming a second barrier oxide layer on the first barrier oxide layer. The electrically conductive path allows reduction of SRAM area by forming a wiring path underneath the barrier oxide layer on the SOI substrate.

13 Claims, 7 Drawing Sheets

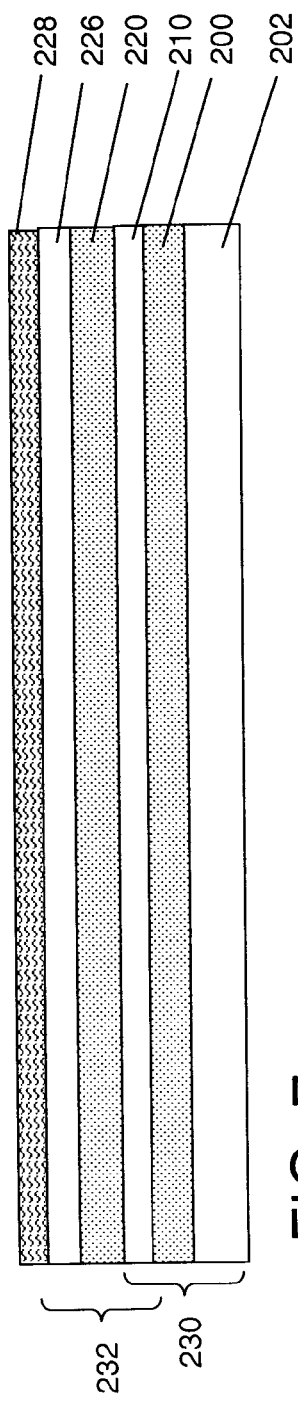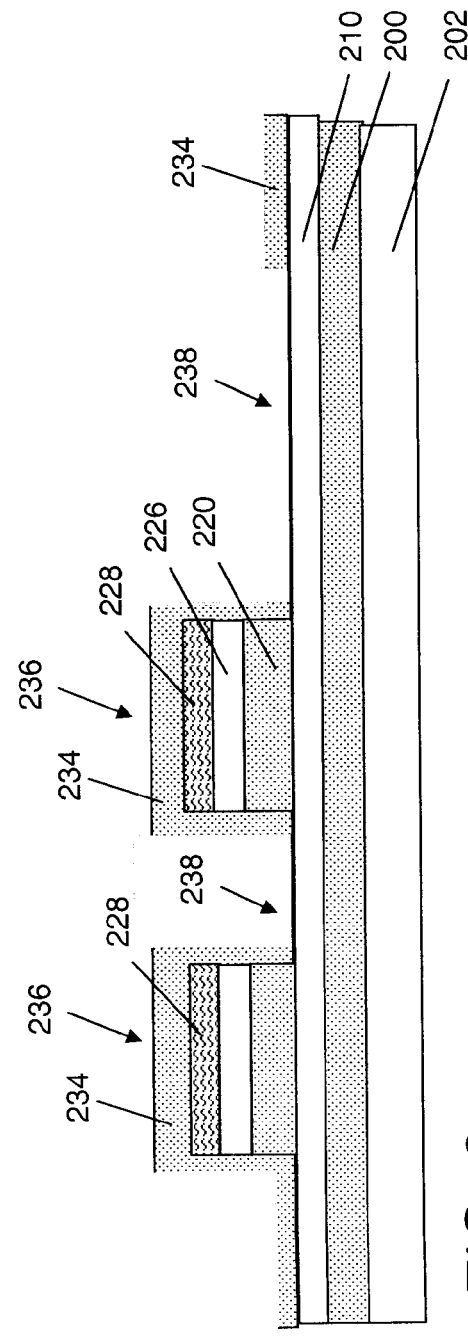

ELECTRICALLY CONDUCTIVE PATH FORMING BELOW BARRIER OXIDE LAYER AND INTEGRATED CIRCUIT

BACKGROUND OF THE INVENTION

1. Technical Field

The invention relates generally to integrated circuit (IC) chip fabrication, and more particularly, to methods of forming an electrically conductive path below a barrier oxide layer of a semiconductor-on-insulator (SOI) substrate and a related IC.

2. Background Art

Static random access memory (SRAM) is used on microprocessors to hold frequently used data and instructions, and thereby eliminate time delays associated with accessing dynamic random access memory (DRAM) and hard drives. However, the SRAM occupies an increasingly large area on the microprocessor.

SUMMARY OF THE INVENTION

Methods of forming an electrically conductive path under a barrier oxide layer of a semiconductor-on-insulator (SOI) substrate and an integrated circuit including the path are disclosed. In one embodiment, the method includes forming an electrically conductive path below a barrier oxide layer of a semiconductor-on-insulator (SOI) substrate, the method comprising: forming a first barrier oxide layer on a semiconductor substrate; forming the electrically conductive path within the first barrier oxide layer; and forming a second barrier oxide layer on the first barrier oxide layer. The electrically conductive path allows reduction of SRAM area by forming a wiring path underneath the barrier oxide layer on the SOI substrate.

A first aspect of the invention provides a method of forming an electrically conductive path below a barrier oxide layer of a semiconductor-on-insulator (SOI) substrate, the method comprising: forming a first barrier oxide layer on a semiconductor substrate; forming the electrically conductive path within the first barrier oxide layer; and forming a second barrier oxide layer on the first barrier oxide layer.

A second aspect of the invention provides a method of forming an electrically conductive path below a semiconductor layer of a semiconductor-on-insulator (SOI) substrate, the method comprising: forming a first barrier oxide layer on a semiconductor substrate; forming a first semiconductor layer on the first barrier oxide layer; depositing a second barrier oxide layer over the first semiconductor layer; forming a second semiconductor layer on the second barrier oxide layer; and forming the electrically conductive path within the first semiconductor layer.

A third aspect of the invention provides an integrated circuit comprising: a first barrier oxide layer on a semiconductor substrate; a second barrier oxide layer over the first barrier oxide layer; an electrically conductive path between the first barrier oxide layer and the second barrier oxide layer; a semiconductor device above the electrically conductive path; and a contact extending from the semiconductor device to the electrically conductive path.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 7-11 show embodiments of a method of forming an electrically conductive path below a semiconductor layer of an SOI substrate, with FIG. 11 showing one embodiment of an IC.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
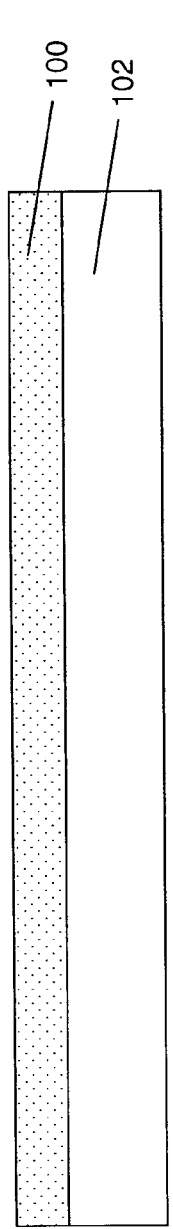
FIGS. 1-6 show embodiments of a method of forming an electrically conductive path below a barrier oxide layer of a semiconductor-on-insulator (SOI) substrate, with FIG. 6 showing one embodiment of an integrated circuit (IC).

Turning to the drawings, FIGS. 1-6 show embodiments of a method of forming an electrically conductive path below a barrier oxide layer of a semiconductor-on-insulator (SOI) substrate. In FIG. 1, a first barrier oxide layer 100 is formed on a semiconductor substrate 102. Semiconductor substrate 102 is wholly semiconductor. Barrier oxide layer 100 may include any now known or later developed oxide material typically used as a dielectric such as silicon oxide ($SiO_2$) and silicon nitride ($Si_3N_4$). Semiconductor substrate 102 may include any now known or later developed substrate materials including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion of or the entire semiconductor substrate 102 may be strained. First barrier oxide layer 100 may be formed using any now known or later developed techniques, e.g., chemical vapor deposition.

Figure 2:
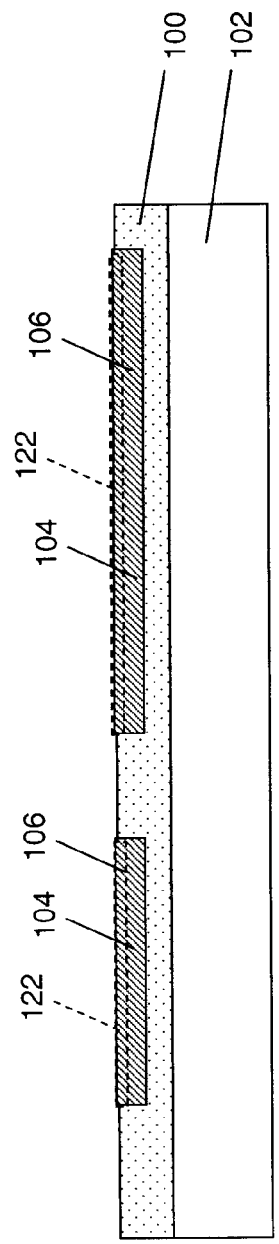

FIG. 2 shows forming an electrically conductive path 104 within first barrier oxide layer 100. As used herein, it is understood that an electrically conductive path 104 (hereinafter "path 104") extends laterally within a layer, i.e., it is not just a vertically extending contact. Path 104 may be formed, for example, using a Damascene process in which path 104 is first lithographically defined in first barrier oxide layer 100 then conductive material 106 is deposited to fill resulting trenches and excess conductive material 106 is removed by means of chemical-mechanical polishing (planarization). That is, a pattern for path 104 is formed in a photoresist mask (not shown), and the pattern is etched into barrier oxide layer 100. The resulting trenches are filled with a conductive material 106 in the form of a metal. Metal 106 may be any now known or later developed refractory metal or silicide (melting point>1100° C.) such as tungsten (W), molybdenum (Mo), tungsten silicide ($WSi_2$) or molybdenum silicide ($MoSi_2$). Alternatively, path 104 may be formed by depositing conductive material 106, patterning conductive material 106 and then forming more of barrier oxide layer 100 about conductive material 106. In an alternative embodiment, conductive material 106 may include doped polysilicon, e.g., n+ doped. In this case, a silicide 122 (shown in phantom in FIG. 2) may be formed in the doped polysilicon, e.g., by depositing a metal, annealing and removing excess metal. Silicide 122 may be any conventional silicide such as cobalt silicide, tungsten silicide, nickel silicide, etc.

Figure 3:
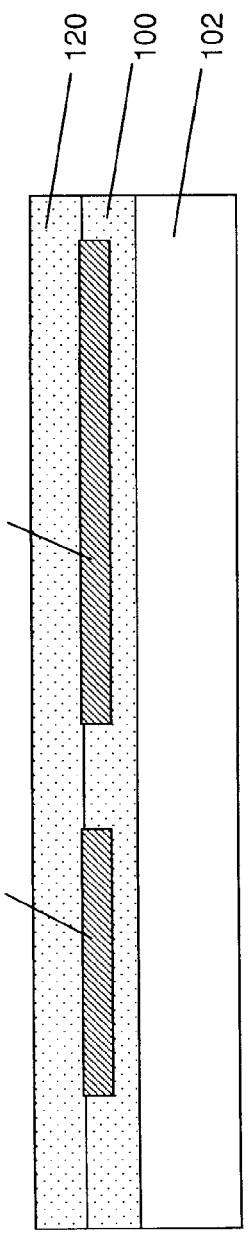
Figure 4:
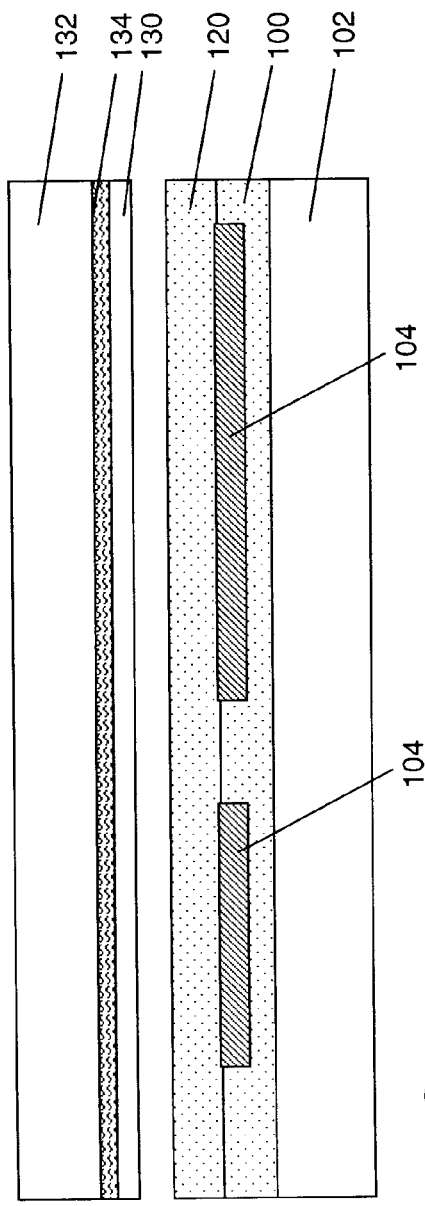
Figure 5:
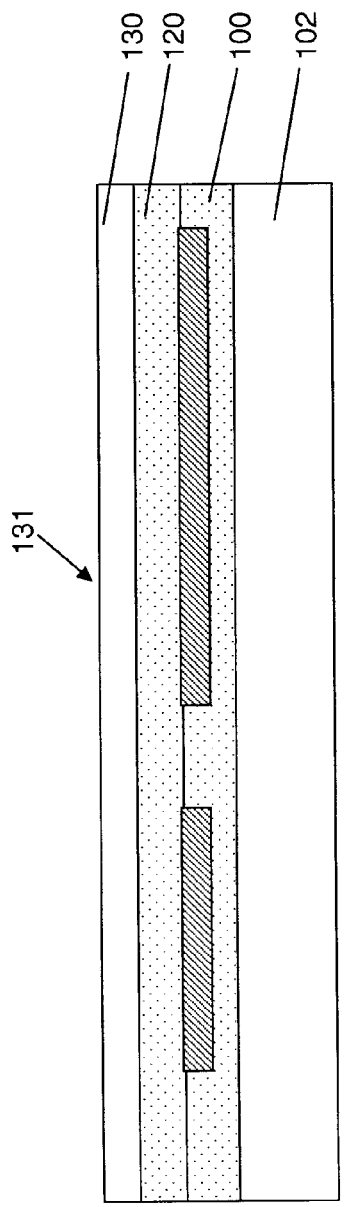

FIG. 3 shows forming a second barrier oxide layer 120 on first barrier oxide layer 100. Second barrier oxide layer 120 may include the same material as first barrier oxide layer 100. FIG. 4 shows bonding a semiconductor layer 130 to second barrier oxide layer 120 to form an SOI substrate 131 (FIG. 5), and FIG. 5 shows semiconductor layer 130 bonded to second barrier oxide layer 120. This process may be provided in any now known or later developed manner such as, as shown in FIG. 4, by providing a sacrificial silicon substrate 132 with hydrogen ($H_2$) implant layer 134 and semiconductor layer 130, bonding semiconductor layer 130 to barrier oxide layer 120 and removing sacrificial silicon substrate 132 and hydrogen implant layer 134, e.g., by cleaving the sacrificial silicon substrate from the SOI substrate (at the hydrogen implant layer).

Figure 6:
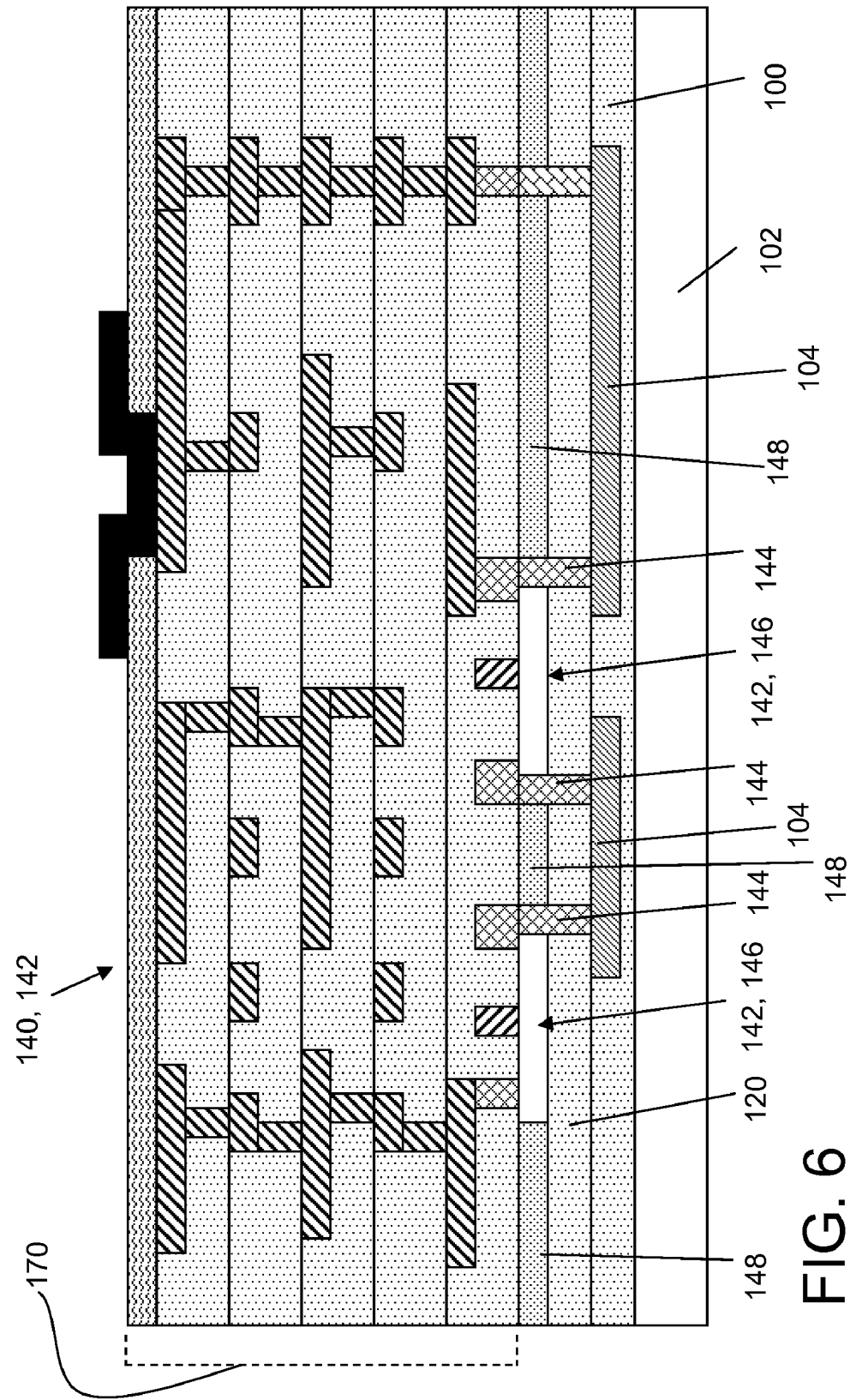

FIG. 6 shows the structure after subsequent processes to form IC 140 using conventional back-end-of-line (BEOL) processing. IC 140 may include a plurality of conventional IC components 170. IC components may include, for example, insulator layers, interconnects, vias, etc. (individual reference numerals omitted). As illustrated, a semiconductor device 142 of IC 140 may include an SRAM. However, it is understood that the teachings of the invention may be applied to practically any semiconductor device such as transistors 146, resistors (not shown), capacitors (not shown) or inductors (not shown). Semiconductor device 142 is mostly formed using any now known or later developed techniques. For example, transistors 146 may be formed by patterning of semiconductor layer 130 (FIG. 5), and subsequent layers may be formed by deposition of an inter-level dielectric (e.g., boro-phoso-silica glass) and Damascene processing. One exception, however, is that a contact 144 may be formed to path 104 from semiconductor device 142, e.g., transistor 146, above second barrier oxide layer 120. That is, contact 144 extends downwardly to path 104. As shown in a lower portion of FIG. 6 relative to transistors 146, in order to ensure proper electrical conductivity, contact 144 may be purposely partially landed on semiconductor device 142, e.g., transistors 146. Isolation region(s) 148, e.g., of silicon oxide ($SiO_2$), separates transistors 146.

Turning to FIGS. 7-11, embodiments of a method of forming an electrically conductive path below a semiconductor layer of an SOI substrate is illustrated. FIG. 7 shows forming a first barrier oxide layer 200 on a semiconductor substrate 202. Barrier oxide layer 200 and semiconductor substrate 202 may be of the same respective materials as described above. FIG. 7 also shows forming a first semiconductor layer 210 on first barrier oxide layer 200, thus forming a first SOI substrate 230. A second barrier oxide layer 220 is deposited over first semiconductor layer 210, and a second semiconductor layer 226 is formed on second barrier oxide layer 220, thus forming a second SOI substrate 232. Second barrier oxide layer 220 may include any dielectric material, e.g., silicon oxide ($SiO_2$), as described above relative to barrier oxide layer 100 (FIG. 1). First and second semiconductor layers 210, 226 may include any now known or later developed semiconductor material such as those described above relative to semiconductor substrate 102 (FIG. 1). In one embodiment, first semiconductor layer 210 is doped with a p-type dopant, which may include but is not limited to: boron (B), indium (In) and gallium (Ga). P-type dopant is an element introduced to a semiconductor to generate free holes (by "accepting" an electron from a semiconductor atom and "releasing" a hole at the same time).

Figure 9:
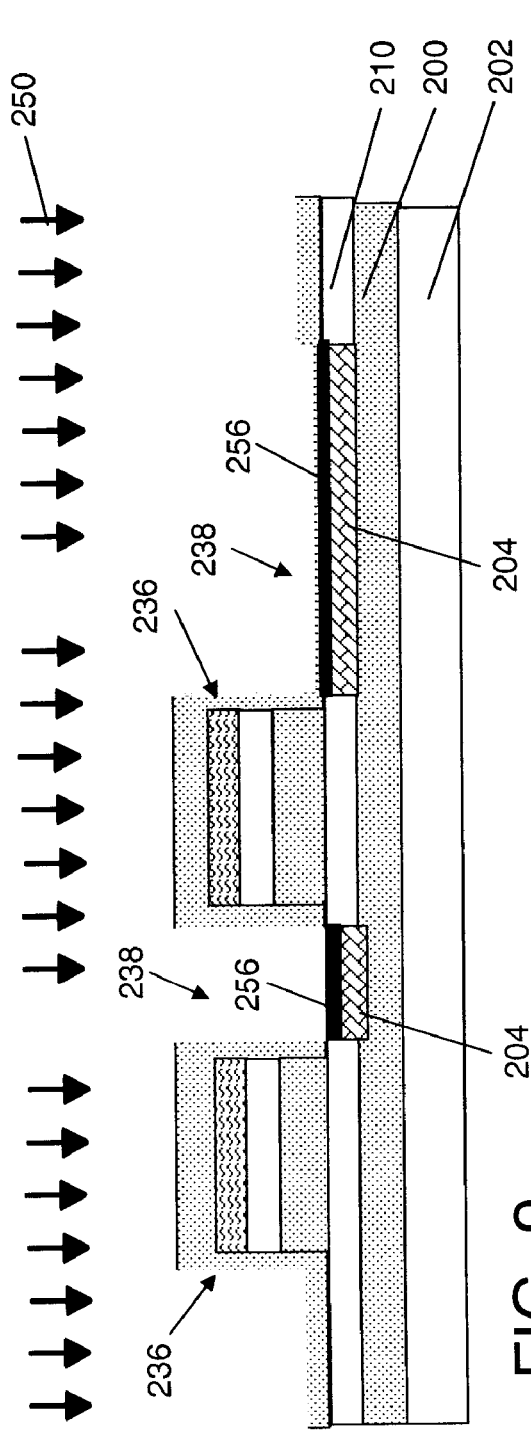
Figure 10:
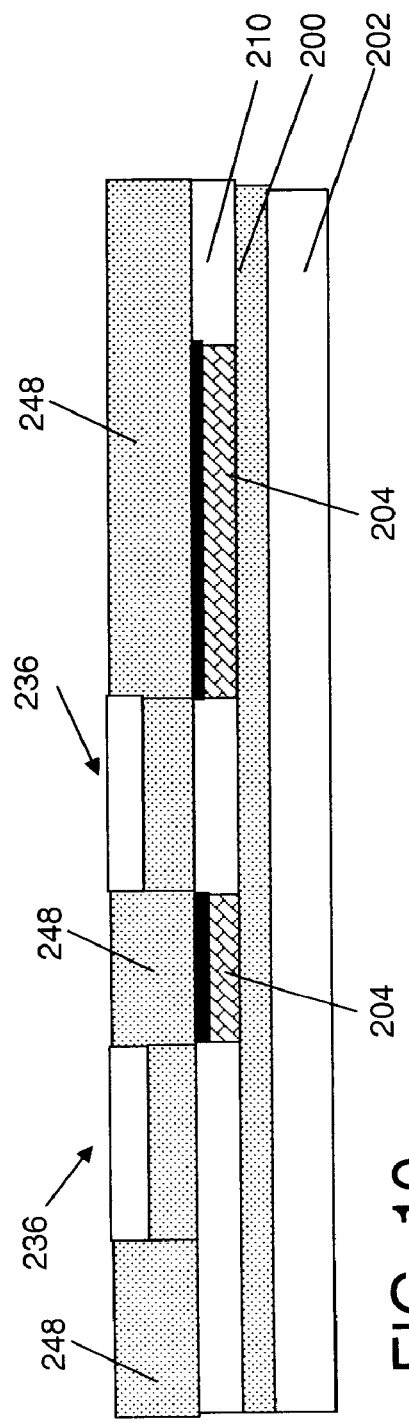

FIGS. 8-10 show forming electrically conductive path 204 within first semiconductor layer 210. In one embodiment, this process includes patterning second semiconductor layer 226 and second barrier oxide layer 220, e.g., using a mask 228 and etching, to form semiconductor device regions 236. Mask 228 may include any now known or later developed pad material such as silicon nitride ($Si_3N_4$). As shown in FIG. 8, another mask 234, e.g., of silicon oxide ($SiO_2$), is deposited and patterned to define at least one exposed area 238 of first semiconductor layer 210. As shown in FIG. 9, a dopant 250 is implanted into the at least one exposed area 238 of first semiconductor layer 210 to form electrically conductive path 204. In one embodiment, dopant 250 is an n+ dopant, which may include but is not limited to: phosphorous (P), arsenic (As), antimony (Sb) and in gallium arsenic (GaAs): sulphur (S), selenium (Se), tin (Sn), silicon (Si), and carbon (C). N-type dopant is an element introduced to a semiconductor to generate free electrons (by "donating" an electron to the semiconductor). In an alternative embodiment, path 204 may be formed as layers 200, 210, 220 are formed by implanting dopant 250 into first semiconductor layer 210 after it is initially formed, e.g., using a mask.

As also shown in FIG. 9, one embodiment includes forming a silicide 256 on (doped) path 204 to provide better electrical conductivity. Silicide 256 may be formed using any now known or later developed techniques such as depositing a thin layer of metal, e.g., cobalt, tungsten, nickel, etc., annealing to form silicide 256, and etching to remove excess metal. Silicide 256 formation does not consume all of polysilicon layer 210.

Figure 11:
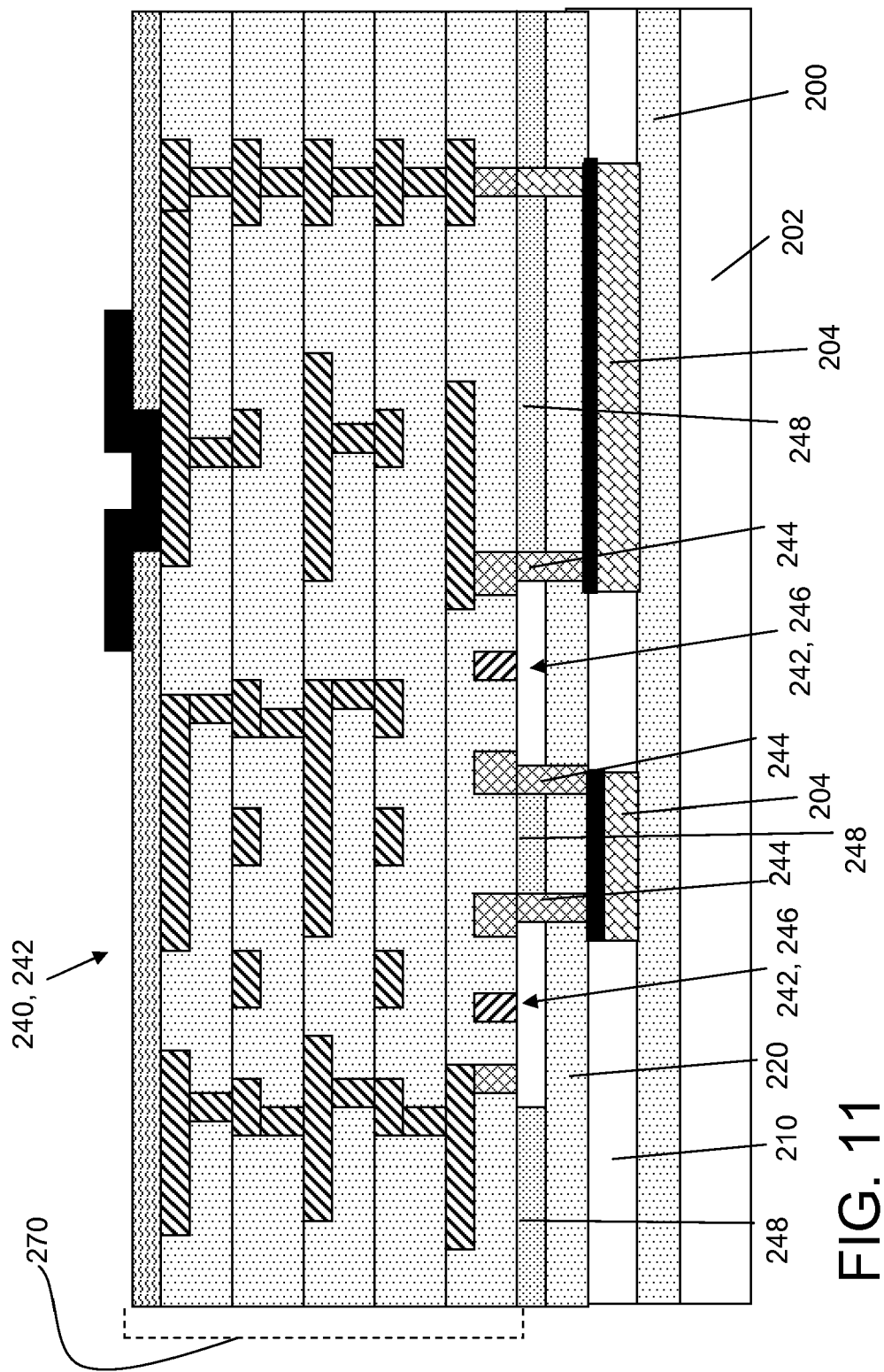

FIG. 10 shows forming an isolation region 248, e.g., of silicon oxide ($SiO_2$), over the at least one exposed area 238 (FIG. 9) of first semiconductor layer 210, which isolates device regions 236, which ultimately become transistors 246 (FIG. 11). This process may include, for example, depositing a dielectric and planarizing with chemical mechanical polishing (CMP). This process may also include removing mask 228 (FIG. 8) using any now known or later developed stripping techniques appropriate for the mask material.

FIG. 11 shows the structure of FIG. 10 after subsequent processing to form IC 240, similar to that described above relative to FIG. 6. IC 240 may include a plurality of conventional IC components 270. IC components may include, for example, insulator layers, interconnects, vias, etc. (individual reference numerals omitted.) As illustrated, a semiconductor device 242 of IC 240 may include an SRAM. However, it is understood that the teachings of the invention may be applied to practically any semiconductor device such as transistors 246, resistors (not shown), capacitors (not shown) and inductors (not shown). Semiconductor device 242 is mostly formed using any now known or later developed techniques. For example, transistors 246 may be formed using the previously patterned semiconductor device regions 236 (FIG. 10), and subsequent layers may be formed by deposition of an inter-level dielectric (e.g., boro-phoso-silica glass) and Damascene processing. One exception, however, is that a contact 244 (e.g., of tungsten) may be formed to path 204 from semiconductor device 242, e.g., transistor 246, above second barrier oxide layer 220. That is, contact 244 extends downwardly to path 204. As shown in a lower portion of FIG. 11 relative to transistors 246, in order to ensure proper electrical conductivity, contact 244 may be purposely partially landed on semiconductor device 242, e.g., transistors 246. Isolation region(s) 248, e.g., of silicon oxide ($SiO_2$), separates transistors 246.

With reference to FIGS. 6 and 11, IC 140, 240 includes first barrier oxide layer 100, 200 on semiconductor substrate 102, 202, second barrier oxide layer 120, 220 over first barrier oxide layer 100, 200, electrically conductive path 104, 204 between first barrier oxide layer 100, 200 and second barrier oxide layer 120, 220, semiconductor device 142, 242 above path 104, 204, and contact(s) 144, 244 extending from semiconductor device 142, 242 to path 104, 204. As noted above, semiconductor device 142, 242 may include a SRAM or other devices such as a transistor 146, 246. Contact 144, 244 may be partially landed on semiconductor device 142, 242, e.g., transistors 146, 246. As shown in FIG. 6, electrically conductive path 104 may be positioned within an upper portion of first barrier oxide layer 102. Alternatively, as shown in FIG. 11, path 204 may include a doped region of semiconductor layer 210 between first barrier oxide layer 200 and second barrier oxide layer 220. In this case, electrically conductive path 204 may further include a silicide 256 (FIG. 9) in the doped region of semiconductor layer 210. An isolation region 148, 248 above electrically conductive path 104, 204 may be provided to isolate semiconductor devices 142, 242, e.g., transistors 146, 246. Contact(s) 144, 244 may extend between semiconductor device 142, 242 and isolation regions 148, 248.

Figure 12:
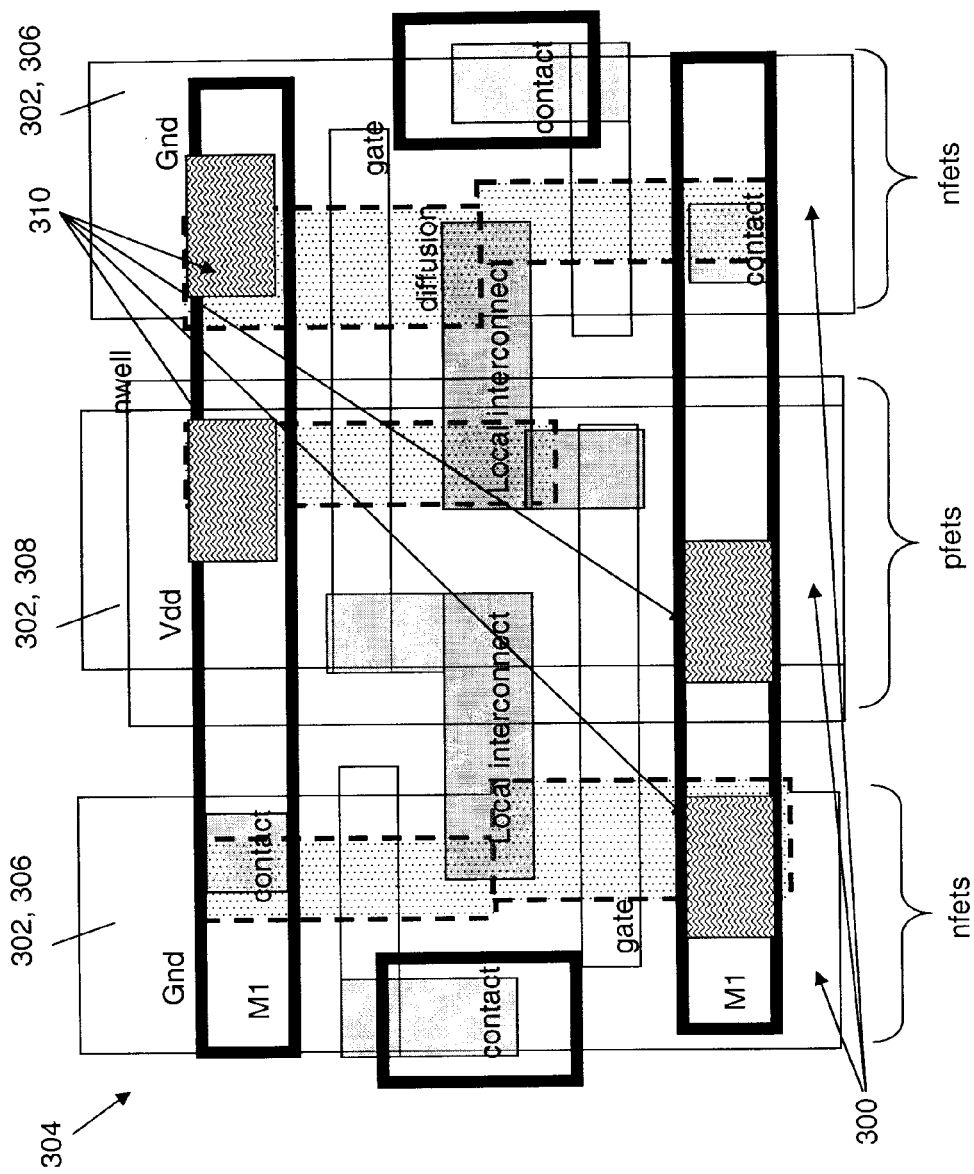
FIG. 12 shows a top view of a wire under a buried barrier layer for a static random access memory (SRAM).

FIG. 12 shows a top view of a wiring layer 300 under a buried barrier oxide layer 302 for a static random access memory (SRAM) 304. Power and ground connections (306, 308) are moved to wiring layer 300 under buried barrier oxide layer 302 by vias 310. As a result, a metal layer M3 (not shown) is not required in SRAM 304, which allows wiring channels to run over SRAM 304, if desired, to improve circuit density. In addition, a dense SRAM can be achieved using a first metal M1 bitline architecture. Finally, the critical area between the contacts and the gates is reduced, providing higher yield.

The methods and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An integrated circuit comprising:
   a first barrier oxide layer on a semiconductor substrate;
   a second barrier oxide layer over the first barrier oxide layer;
   a semiconductor layer between and completely separating the first barrier oxide layer and the second barrier oxide layer, a portion of the semiconductor layer entirely containing an electrically conductive path including a metal, wherein the semiconductor layer is located directly below the second barrier oxide layer;
   a semiconductor device above the electrically conductive path, the semiconductor device including a transistor;
   a plurality of contacts extending from the semiconductor device to the electrically conductive path, each of the plurality of contacts directly contacting a sidewall of the transistor; and
   a plurality of isolation regions entirely above the electrically conductive path, wherein the transistor is located between the plurality of isolation regions on a same level as the plurality of isolation regions, and wherein each of the plurality of contacts extends between and separates one of the plurality of isolation regions and the transistor.

2. The integrated circuit of claim 1, wherein the semiconductor device includes a static random access memory (SRAM).

3. The integrated circuit of claim 1, wherein the contact is partially landed on the semiconductor device.

4. The integrated circuit of claim 1, wherein the electrically conductive path is within an upper portion of the first barrier oxide layer.

5. The integrated circuit of claim 1, wherein the electrically conductive path includes a doped region.

6. The integrated circuit of claim 1, wherein the electrically conductive path further includes a silicide in the doped region.

7. The integrated circuit of claim 1, wherein the electrically conductive path includes a dopant selected from the group consisting of: phosphorous (P), arsenic (As), antimony (Sb), and gallium arsenic (GaAs).

8. The integrated circuit of claim 1, wherein the semiconductor layer further includes a second portion having a p-type dopant, the second portion being distinct from the portion including the electrically conductive path.

9. The integrated circuit of claim 1, wherein the electrically conductive path includes an n-type dopant, and wherein the semiconductor layer further includes a second portion having a p-type dopant, the second portion being distinct from the portion including the electrically conductive path.

10. The integrated circuit of claim 6, wherein the silicide includes at least one of: annealed cobalt, annealed tungsten, or annealed nickel.

11. The integrated circuit of claim 1, wherein the semiconductor layer contacts the second barrier oxide layer.

12. The integrated circuit of claim 1, wherein the electrically conductive path is formed on a same level as a portion of the first barrier oxide layer.

13. The integrated circuit of claim 1, wherein one of the plurality of contacts further contacts a sidewall of one of the plurality of isolation regions.

* * * * *